United States Patent
Rivoir

(10) Patent No.: US 9,575,726 B2
(45) Date of Patent: Feb. 21, 2017

(54) BIT SEQUENCE GENERATOR AND APPARATUS FOR CALCULATING A SUB-RATE TRANSITION MATRIX AND A SUB-RATE INITIAL STATE FOR A STATE MACHINE OF A PLURALITY OF STATE MACHINES

(75) Inventor: Jochen Rivoir, Magstadt (DE)

(73) Assignee: Advantest Corporation, Tokyo (JP)

( * ) Notice: Subject to any disclaimer, the term of this patent is extended or adjusted under 35 U.S.C. 154(b) by 318 days.

(21) Appl. No.: 13/814,234

(22) PCT Filed: Aug. 3, 2010

(86) PCT No.: PCT/EP2010/061310
§ 371 (c)(1),
(2), (4) Date: Apr. 27, 2015

(87) PCT Pub. No.: WO2012/016588
PCT Pub. Date: Feb. 9, 2012

(65) Prior Publication Data
US 2015/0268933 A1    Sep. 24, 2015

(51) Int. Cl.
*G06F 7/58*    (2006.01)
*H03K 3/64*    (2006.01)
*H03K 3/84*    (2006.01)

(52) U.S. Cl.
CPC .............. *G06F 7/58* (2013.01); *G06F 7/584* (2013.01); *H03K 3/64* (2013.01); *H03K 3/84* (2013.01); *G06F 2207/582* (2013.01)

(58) Field of Classification Search
None
See application file for complete search history.

(56) References Cited

U.S. PATENT DOCUMENTS

| | | | | |
|---|---|---|---|---|
| 5,446,683 | A * | 8/1995 | Mullen | ............ G01R 31/31813 708/256 |
| 5,864,491 | A | 1/1999 | Smeets | |
| 7,613,757 | B1 * | 11/2009 | Abbaszadeh | ........... G06F 1/025 708/250 |
| 2004/0220985 | A1 * | 11/2004 | Morris | .................... G06F 7/584 708/250 |

(Continued)

FOREIGN PATENT DOCUMENTS

| | | |
|---|---|---|
| WO | 2010034326 A1 | 4/2010 |
| WO | 2010034327 A1 | 4/2010 |

*Primary Examiner* — David H Malzahn

(57) ABSTRACT

A bit sequence generator for generating a bit sequence defined by a generating function and an initial state of the generating function comprising a plurality of state machines and a multiplexer. Each state machine of the plurality of state machines generates a time-interleaved bit sequence, wherein a state machine generates a bit of the time-interleaved bit sequence for a current time step based on at least one bit generated by the state machine for a preceding time step, the generating function of the bit sequence to be generated, and the initial state of the generating function and independent from a time-interleaved bit sequence generated by another state machine of the plurality of state machines. Further, a multiplexer selects successively one bit from each generated time-interleaved bit sequence in a repetitive manner to obtain the bit sequence defined by the generating function and the initial state of the generating function.

20 Claims, 9 Drawing Sheets

(56) References Cited

U.S. PATENT DOCUMENTS

2005/0071399 A1* 3/2005 Bonaccio ......... G01R 31/31703
708/250
2009/0243990 A1* 10/2009 Komori .................. G06F 7/584
345/99
2015/0268933 A1* 9/2015 Rivoir .................... G06F 7/584
708/250

* cited by examiner

BIT SEQUENCE GENERATOR AND APPARATUS FOR CALCULATING A SUB-RATE TRANSITION MATRIX AND A SUB-RATE INITIAL STATE FOR A STATE MACHINE OF A PLURALITY OF STATE MACHINES

CROSS REFERENCE

The present disclosure claims the benefit of PCT International Application No. PCT/EP2010/061310 filed on Aug. 3, 2010, which is incorporated by reference herein.

TECHNICAL FIELD

Embodiments according to the disclosure relate to the field of bit sequencing, and particularly to the field of generation of bit sequence generation using state machines.

BACKGROUND

Random numbers or pseudo-random numbers may be used in a wide field of applications in modern technology, for instance, in the field of test systems, cryptography, numerical simulation and the generation of noise signals, to name but a few. Random numbers or pseudo-random numbers may technically be generated by a true random number generator or a pseudo-random number generator, respectively.

While a true pseudo-random number generator typically employs physical, real source of randomness, a pseudo-random number generator typically does not employ an element showing a statistical true randomness. Examples of such elements are, for instance, electric resistors with Nyquist noise, electrical tunneling elements or elements based on radio active decay with a shot noise behavior or closed feedback loops employing the feedback signal as the noise source to name but a few.

Pseudo-random number generators typically do not employ such elements of true randomness but are based on a deterministic behavior such that the numbers generated by a pseudo-random number generator are not true random numbers.

Thus, true random number generators and pseudo-random number generators are utilized whenever a random or pseudo-random value is important or advisable to be used in a field of application, such as the examples mentioned above.

Pseudo-random number generators, compared to true random number generators, typically allow a faster generation of the numbers, are very often more easily to implement and show a lower energy consumption than corresponding true random number generators. However, since the pseudo-random number generators are deterministic systems, the generated numbers may be calculated based on the knowledge of the inner structure of a pseudo-random number generator and the knowledge of a state of it. This may be a disadvantage under some circumstances but may be desired under other circumstances, when, for instance, a periodic behavior or reproducibility may be important in some applications.

In digital implementations or applications the pseudo-random numbers generated by a pseudo-random number generator typically comprise digital or binary units. Depending on the concrete implementation, a pseudo-random number generator may, in such a case, provide a pseudo-random bit stream comprising a sequence of individual bits or a pseudo-random word stream comprising a sequence of words. Each word typically comprises a plurality of bits, e.g. 4 bits, 6 bits, 8 bits, 16 bits, 32 bits or the like. In other words, a word of a word stream typically comprises a plurality of bits and the word may be considered as a part of a sequence of pseudo-random bits. Therefore, in many applications, a pseudo-random bit stream and a pseudo-random word stream may be derived from each other.

SUMMARY

Due to the ever increasing operational speeds and frequencies of circuits, computer systems and other devices, a demand for a faster generation of pseudo-random bit streams and word streams with a sufficiently good statistical distribution concerning randomness of the bits exists, for instance, to allow faster processing speeds of test applications, numerical simulations, cryptographic applications, generation of noise signals or other data, information and signals depending on the application in mind.

Embodiments according to the invention relate to the generation of bit sequences and particularly to a bit sequence generator, a method for generating a bit sequence and an apparatus and a method for calculating a sub-rate transition matrix and a sub-rate initial state for a state machine.

According to one embodiment of the present disclosure, a bit sequence generator for generating a bit sequence defined by a generating function and an initial state of the generating function comprises: 1) a plurality of state machines, wherein each state machine is configured to generate a time-interleaved bit sequence; and 2) a multiplexer configured to select successively one bit from each generated time-interleaved bit sequence. A state machine generates a bit of the time-interleaved bit sequence for a current time step based on at least one bit generated by the state machine for a preceding time step.

DISCLOSURE

An embodiment of the disclosure provides a bit sequence generator for generating a bit sequence defined by a generating function and an initial state of the generating function comprising a plurality of state machines and a multiplexer. Each state machine of the plurality of state machines generates a time-interleaved bit sequence, wherein a state machine generates a bit of the time-interleaved bits sequence for a current time step based on at least one bit of the time-interleaved bit sequence generated for a preceding time step, based on a generating function of a bit sequence to be generated, based on an initial state of the generating function and independent from a time-interleaved bit sequence generated by another state machine of the plurality of state machines. Further, the multiplexer is configured to select successively one bit from each generated time-interleaved bit sequence in a repetitive manner to obtain the bit sequence defined by the generating function and the initial state of the generating function.

A further embodiment of the disclosure provides an apparatus for calculating a sub-rate transition matrix and a sub-rate initial state for a state machine of a plurality of state machines. The apparatus comprises a processor configured to calculate the sub-rate initial state for the state machine, based on a generating function of a full rate bit sequence, an initial state of the generating function and a number of state machines of the plurality of state machines. Further, the processor is configured to calculate the sub-rate transition matrix for the state machine based on the generating function and the number of state machines.

Embodiments according to the present disclosure are based on the central idea that a fast bit sequence defined by a generating function and an initial state of the generating function can be generated with a high bit rate by merging two or more time-interleaved bit sequences generated independent from each other. In this way, each time-interleaved bit sequence can be generated with a sub-rate of the bit rate of the bit sequence obtained by merging the plurality of time-interleaved bit sequences.

Therefore, the state machines generating the time-interleaved bit sequences can work at lower clock frequencies than the frequency (bit rate) of the generated bit sequence. Only the multiplexer must be able to select bits from the generated time-interleaved bit sequences with the full bit rate of the bit sequence. Therefore, the required hardware demands for the state machines can be significantly reduced, in comparison to a single state machine providing the bit sequence with the same bit rate directly.

In some embodiments according to the disclosure, the state machine of the plurality of state machines generates the time-interleaved bit sequence based on a sub-rate transition matrix and a sub-rate initial state. The sub-rate transition matrix and the sub-rate initial state are based on the generating function and the initial state of the generating function.

The sub-rate transition matrix and the sub-rate initial state may be determined by an apparatus for calculating a sub-rate transition matrix and a sub-rate initial state for a state machine as mentioned above.

Therefore, some embodiments according to the disclosure may relate to a bit sequence generator comprising an apparatus for calculating a sub-rate transition matrix and a sub-rate initial state for a state machine of the plurality of state machines. The apparatus may calculate a sub-rate transition matrix and a sub-rate initial state for each state machine of the plurality of state machines, so that the merged time-interleaved bit sequences of the state machines result in the full rate bit sequence defined by the generating function and the initial state of the generating function.

In some embodiments according to the disclosure, the bit sequence defined by the generating function and the initial state is a pseudorandom bit sequence.

BRIEF DESCRIPTION OF THE DRAWINGS

Embodiments of the present disclosure will be detailed subsequently referring to the appended drawings, in which.

In the following, the same reference numerals are partly used for objects and functional units having the same or similar functional properties and the description thereof with regard to a figure shall apply also to other figures in order to reduce redundancy in the description of the embodiments.

DETAILED DESCRIPTION

Figure 1:
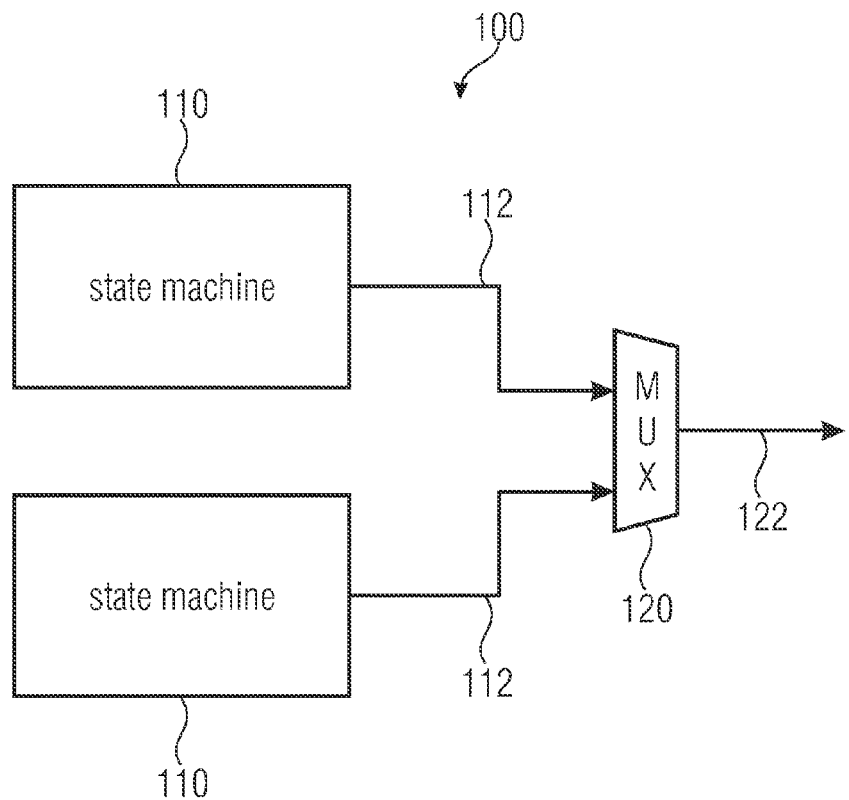
FIG. 1 is a block diagram of an exemplary bit sequence generator in accordance with an embodiment of the present disclosure.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

FIG. 1 shows a block diagram of a bit sequence generator 100 according to an embodiment of the disclosure. The bit sequence generator 100 comprises a plurality of state machines and a multiplexer 120. Each state machine 110 of the plurality of state machines is configured to generate a time-interleaved bit sequence 112, wherein a state machine 110 generates a bit of the time-interleaved bit sequence 112 for a current time step based on at least one bit generated by the state machine for a preceding time step, based on a generating function of a bit sequence 122 to be generated, based on an initial state of the generating function and independent from a time-interleaved bit sequence 112 generated by another state machine 110 of the plurality of state machines. Further, the multiplexer 120 selects successively one bit from each generated time-interleaved bit sequence 112 in a repetitive manner to obtain the bit sequence 122 defined by the generating function and the initial state of the generating function.

By merging the time-interleaved bit sequences 112 generated by the plurality of state machines, a bit sequence 122 with a significantly higher bitrate than the bitrate of the time-interleaved bit sequences 112, can be obtained. Therefore, the state machine 110 can run at a lower clock rate reducing the hardware efforts and/or the power consumption. Further, since the state machines 110 generate the time-interleaved bit sequences 112 independent from each other, independent hardware units can be used. In this way, for example, existing state machines generating bit sequences at a low bitrate can be used for generating a bit sequence with a multiple of this bitrate by using a multiplexer 120 for merging the independent bitstreams.

Generating the time-interleaved bit sequences independent from each other means, in this case, that a state machine 110 generates the time-interleaved bit sequence independent from a current or a previous state or an output of one of the other state machines 110 of the plurality of state machines. A link between each other is only given by the fact that the state machines generate their time-interleaved bit sequence based on the same generating function of the pseudorandom bit sequence 112 to be generated and on the initial state of the generating function. In this way, the time-interleaved bit sequences 112 add up to the bit sequence 122 to be generated, although each single state machine 110 does not have to know what the other state machines are doing.

Since the multiplexer 120 selects successively one bit from each generated time-interleaved bit sequence 112 in a repetitive manner, a time-interleaved bit sequence 112 comprises each M-th bit of the bit sequence 122 to be generated, wherein M is the number of state machines 110 of the plurality of state machines 110. For example, if the bit sequence generator 110 comprises two state machines 110, as shown in FIG. 1, the first state machine generates a time-interleaved bit sequence 112 comprising the first, third, fifth, seventh bit, etc. of the bit sequence 122 to be generated and the second state machine 110 generates a time-interleaved bit sequence 112 comprising the second, fourth, sixth bit, etc. of the bit sequence 122 to be generated.

The bit sequence generator 100 may comprise two or more state machines 110.

A state machine 110 may be, for example, a finite state machines (FSM) or a linear finite state machines (LFSM).

The generation of the time-interleaved bit sequence 112 is based on the generating function and the initial state of the generating function. The generating function as well as the initial state may be defined by a user or may be stored by a storage device. In other words, the generating function and the initial state may be given or predefined. For this, the generating function may be represented by parameters, coefficients, variables, a formula or another mathematical description. Further, the initial state may be represented by an initial state bit sequence. For example, the generating function may be a generating polynomial g(x) of degree P represented by P coefficients. In this connection, for example, the bit sequence is defined by a generating function and an initial state is equal to a wording like the bit sequence is defined by coefficients of a generating function and an initial state bit sequence. Consequently, also generating the bit of the time-interleaved bit sequence based on the generating function and the initial state means, for example, generating the bit of the time-interleaved bit sequence based on the coefficients of the generating function and the initial state bit sequence.

Some embodiments according to the disclosure relate to a generation of a pseudorandom bit sequence. In other words, the bit sequence to be generated is a pseudorandom bit sequence. In the following, embodiments are described in connection with the generation of a pseudorandom bit sequence, although the inventive concept is not limited to pseudorandom bit sequence.

A pseudorandom bit sequence may be defined by a generating polynomial. Such a pseudorandom bit sequence may be generated by a linear feedback shift register. For example, pseudo random bit sequences (PRBS), {s(i)}, with bit rate f can be generated as the output of a linear feedback shift register (LFSR), clocked at frequency f.

Figure 5:
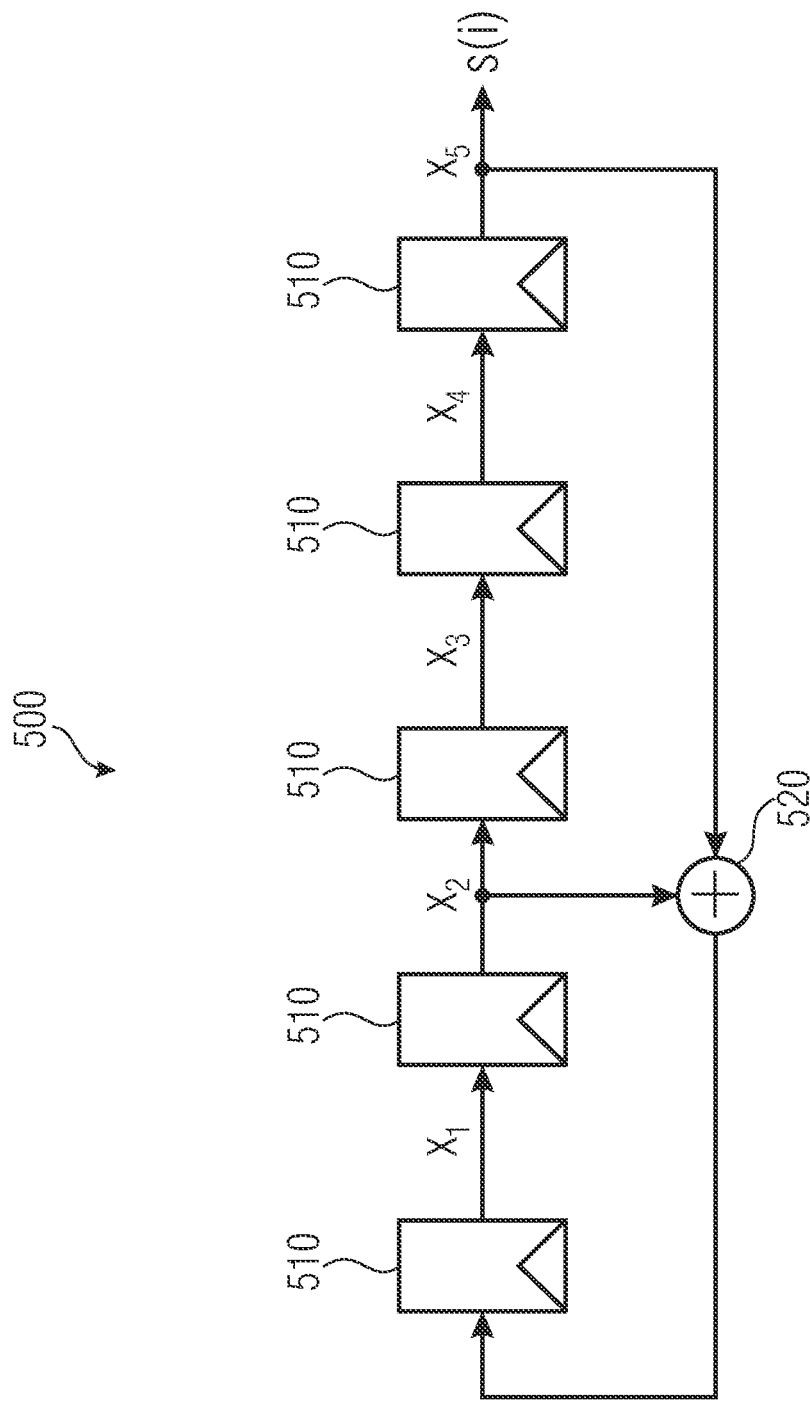
FIG. 5 is a block diagram of an exemplary linear feedback shift register in accordance with an embodiment of the present disclosure.

FIG. 5 shows an example for a linear feedback shift register 500 with the generating polynomial $g(x)=1+x^2+x^5$. This linear feedback shift register 500 comprises five clock registers 510 and a logic XOR-unit 520 logically combining the output of the second register $x_2$ and the output of the fifth register $x_5$ and provides the result to an input of the first register. The corresponding pseudorandom sequence s(i) is output by the fifth register.

A general LFSR can be described in terms of its generating polynomial g(x) of degree P, i.e. $g_P \neq 0$ and $g_p = 0$, p>P $$g(x)=1+g_1x+g_2x^2+ \ldots +g_Px^P. \tag{1}$$

When a coefficient $g_p \in B$ of g(x) (coefficients of the generating function) equals 1, the output of the p-th shift register stage is included in the XOR function for the next value of the first stage.

In some embodiments, the same pseudorandom bit sequence s(i) with bitrate f can be generated by time interleaving (multiplexing) M time-interleaved bit sequences with bitrate f divided by M.

For example, a state machine 110 can generate one or more bits of the time-interleaved bit sequence 112 for each time step. For example, by using a linear feedback shift register similar to the one shown in FIG. 5, one bit of the time-interleaved bit sequence 112 may be generated each time step. In some embodiments, state machines generating more than one bit of the time-interleaved bit sequence 112 each time step may be used. The number of bits generated each time step can be set and predefined by the used hardware of the state machine 110. In other words, a state machine 110 of the plurality of state machines 110 can generate a predefined number of bits (1 or more) of the corresponding time-interleaved bit sequence 112 for each time step.

In this way, it can generate repeatedly the predefined number of bits of the time-interleaved bitstream 112 with a sub-rate (corresponding to the length of a time step) significantly lower than the full rate of the pseudorandom bit sequence as provided by the multiplexer 120. In other words, a state machine 110 of the plurality of state machines 110 may generate the predefined number of bits of the time-interleaved bit sequence 112 with a sub-rate and the multiplexer 120 provides the generated pseudorandom bit sequence 122 with a full rate being an integer multiple of the sub-rate.

The ratio of the sub-rate, with which a state machine is operated to the full rate that the pseudorandom bit sequence 112 is provided with, may depend on the predefined number of bits of the time-interleaved bit sequences 112 (generated in parallel) and the number of state machines 110. In other words, the above-mentioned integer multiple may be the product of the predefined number of bits of the time-interleaved bit sequence 112 and a number of state machines of the plurality of state machines 110. For example, each state machine generates 4 bits of the corresponding time-interleaved bit sequence during each clock cycle of the state machine, and the plurality of state machine comprises two state machines. Then the pseudorandom bit sequence can be generated with a bit rate (full rate) being 8 times higher than the clock rate (sub rate) that the state machine is operated with.

In some embodiments according to the present disclosure, a state of a state machine 110 may depend on a predefined number of state bits. The predefined number of state bits may be generated during the same time step and may depend on state bits from a preceding time step (e.g. the directly preceding time step). This predefined number of state bits may be equal to the predefined number of bits of the time-interleaved bit sequence 112 of this time step, but the predefined number of state bits may also be larger than the predefined number of bits of the time-interleaved bit sequence 112. In other words, a state of a state machine 110 of the plurality of state machines 110 may be defined by a predefined number of state bits generated by the state machine 110 during the same time step. Further, the predefined number of state bits may comprise at least the predefined number of bits of the time-interleaved bit sequence 112 for the same time step. Although the state bits and the bits of the time-interleaved bit sequence generated during the same time step may be different, the state bits are the bits of the time-interleaved bit sequence in a some embodiments. In other words, a state machine may automatically generate bits of the time-interleaved bit sequence represented by the state bits by changing the state.

Since a state of a state machine of the plurality of state machines of the current time step may depend on a state of the state machine of a preceding time step, the state machine may generate a bit of the time-interleaved bit sequence for the current time step independence of the state of the state machine of the preceding time step.

If a state machine 110 may determine more than one bit of the time-interleaved bit sequence 112 for each time step (or clock cycle of the state machine), then bits of the time-interleaved bit sequence 112 that are generated in parallel may be serialized to obtain the time-interleaved bit sequence 112. For these embodiments, the state machine 110 may comprise a serializer. The serializer may select, for each time step, the bits of the time-interleaved bit sequence 112 contained by the state bits generated for a time step to provide the time-interleaved bit sequence 112 in a serial manner. This may be done with an intermediate rate, wherein the intermediate rate is equal to the sub-rate multiplied with a predefined number of bits of the time-interleaved bit sequence 112, generated during the same time step. In other words, the bits of the time-interleaved bit sequence 112 generated in parallel by a state machine 110 are serialized and therefore comprise a bitrate being the sub-rate multiplied with the number of parallelly generated bits of the time-interleaved bit sequence (predefined number of bits of the time-interleaved bit sequence).

Consequently, the full rate with which the generated pseudorandom bit sequence is provided may be equal to the intermediate rate multiplied with the number of state machines 110 of the plurality of state machines.

Figure 6:
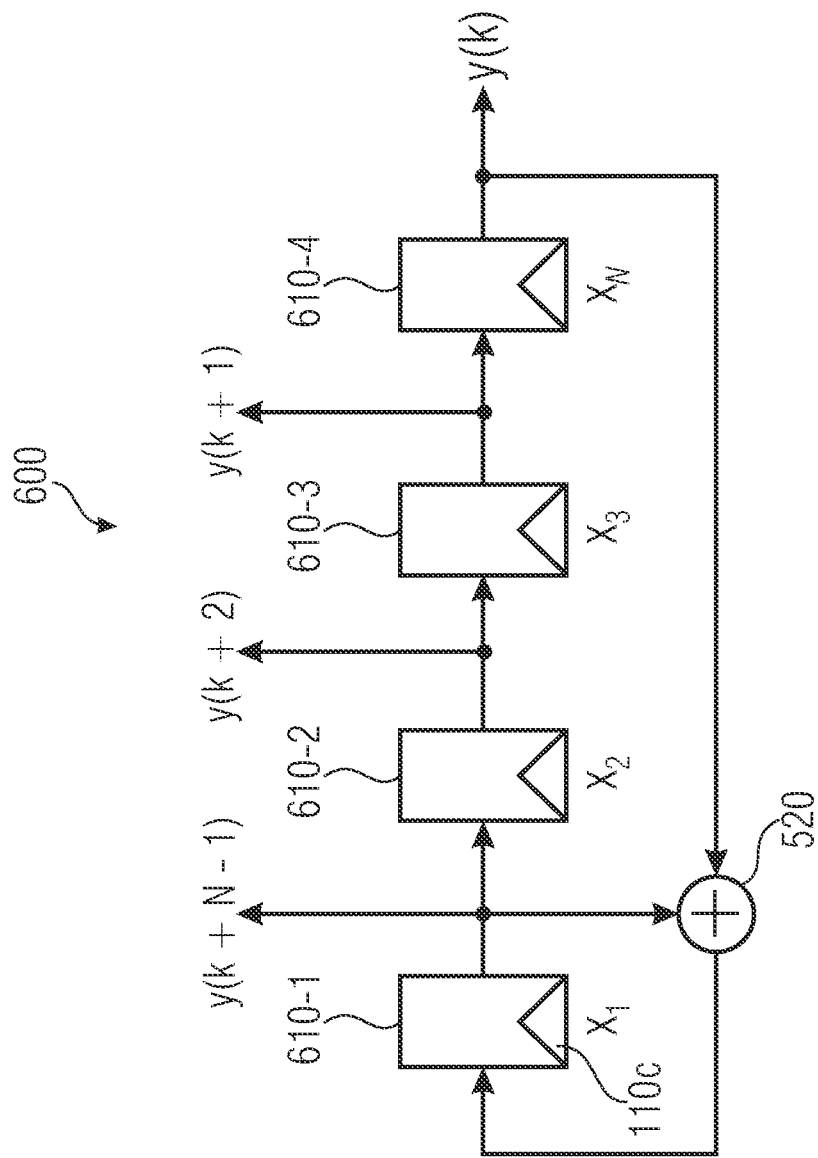
FIG. 6 is a block diagram of an exemplary linear feedback shift register in a parallel read-out mode of operation in accordance with an embodiment of the present disclosure.

A state machine 110 may be implemented in various ways. For example, a linear feedback shift register (LFSR), as mentioned above, may be used. Alternatively, a linear feedback shift register operated in a parallel readout mode may be used. FIG. 6 shows a linear feedback shift register 600 in a configuration for generating a word stream instead of a bit stream. To achieve this, the linear feedback shift register 600 of FIG. 6 differs from that of FIG. 5 with respect to the configuration of the output of the linear feedback shift register 600. While in the case of the LFSR of FIG. 5 the output of the LFSR mainly represents the output of the $5^{th}$ register, the output of the LFSR 600 of FIG. 6 is coupled to all outputs of the four registers 610-1, . . . , 610-4. The output of the LFSR 600 provides as bit y (k) the signal present at the output of the register 610-4, as bit k+1 the signal present at the output of third register 610-3, as bit k+2 the signal present at the output of the second register 610-2 and as bit k+N−1=k+3 the output of the first register 610-1.

The LFSR 600 of FIG. 6 can produce a bit sequence or bit stream by the previously described parallel read-out of the N=4 registers and afterwards clocking the LFSR N=4 times, while the output during these clocking sequences is ignored. The LFSR 600 as shown in FIG. 6 can not only be used to obtain words with N bits each but any number of bits R being smaller than or equal to the number of registers N of the LFSR 600. In this case, the parallel read-out may be limited to R stages and a subsequent clocking of the LFSR 600 R times, while ignoring the output during these intermediate clockings.

Figure 7:
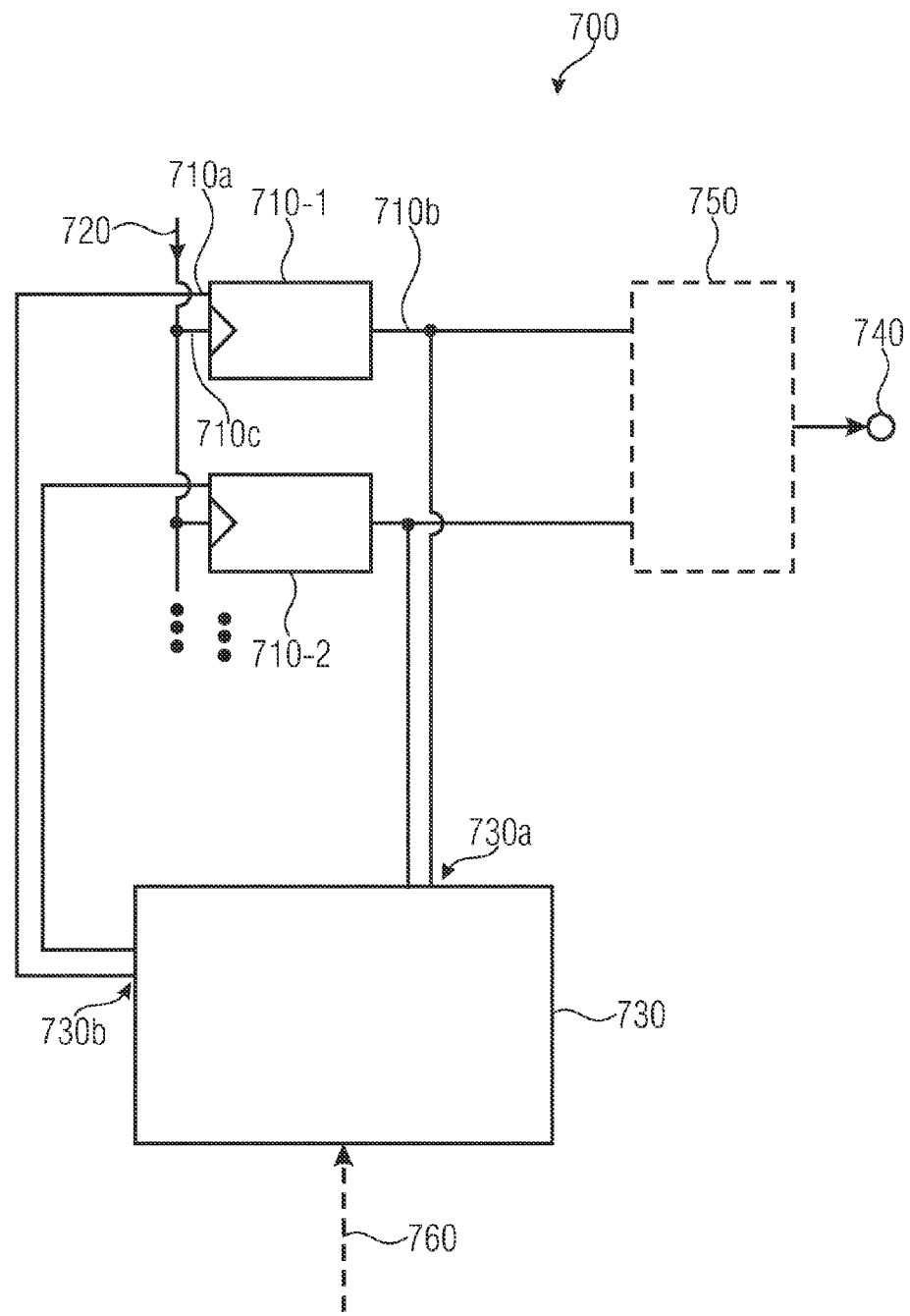
FIG. 7 is a block diagram of an exemplary state machine in accordance with an embodiment of the present disclosure.

FIG. 7 shows an alternative implementation of a state machine 700. The state machine 700 comprises a plurality of clocked registers 710, each register 710 comprising an input 710a for a feedback signal or an input signal and an output 710b for an output signal. Moreover, the registers 710 further comprise a clock signal input 710c for a clock signal. Similar to the registers of FIGS. 5 and 6, the registers 710 are also adapted to store at least two states (e.g. 0 or 1) in response to a signal presented to their respective inputs 710a and a corresponding clock signal presented to the clock signal input 710c. The registers 710 are adapted to provide at their outputs 710b a signal indicative of their state.

The block diagram of FIG. 7 shows a first register 710-1 and a second register 710-2, both coupled to a common clock signal line 720 to provide the registers 710 with a corresponding clock signal in parallel via their clock signal inputs 710c. Moreover, the state machine 700 comprises a feedback circuit 730 with a plurality of inputs 730a and a plurality of outputs 730b. The number of inputs 730a may correspond at least to the number N of registers 710 of the state machine 700 so that each of the registers 710 can be connected to an individual input of the feedback circuit 730 in the embodiment shown here. Accordingly, the number of outputs 730b of the feedback circuit 700 may also correspond to at least the number of registers 710 so that each of the registers 710 can be connected via its input 710a to one of the outputs 730b of the feedback circuit 730. However, in other embodiments according to the present disclosure the number of inputs or outputs of the feedback circuit 730 may be smaller or larger.

The plurality of registers 710 and the feedback circuit 730 form a closed feedback loop, wherein the feedback circuit 730 can generate a plurality of feedback signals which are provided to the inputs 710a of the registers 710. Since the registers 710 are adapted to assume a state corresponding to a signal provided to the input 710a upon reception of a clock signal (e.g. an edge or a transition or level of the clock signal) provided via the clock signal line 720, the feedback circuit 730 can control the change of states via a creation of the feedback signals from clock cycle to clock cycle of the clock signal. Sometimes a register is also referred to as a flip-flop. In other words, a register, such as the registers 710, can be adapted to store at least two different states. The state to be stored can be provided to the input 710a of the register 710 and stored therein upon reception of a clock signal. In contrast, a latch may be transparent or freeze a state depending on a control signal provided to a control signal input.

The outputs 710b of the registers 710 can be coupled directly or indirectly to an output 740 of the state machine so that the output signals of the registers 710 are provided not only to the feedback circuit 730 but also to the output 740.

The output of the feedback circuit can be controlled by a feedback function and the signals provided to the inputs 730a of the feedback circuit 730. The feedback signals are generated and provided via the outputs 730b to the inputs 710a of the registers 710. The feedback circuit 730 can be, in this context, adapted such that a single application of the feedback function leads to new states of the registers 710, for example, representing a state of a linear feedback shift register, for instance, as shown in FIG. 5, initialized with the original states of the registers 710 after being clocked multiple times. In other words, the feedback function as implemented in the feedback circuit 730 can be used to generate feedback signals and provide them to the inputs 710a of the registers 710 which correspond to a multiple application of clock cycles of a clock signal to a LFSR initialized with states as present in the registers 710 of the state machine 700 before providing the appropriate clock signal to the clock signal line 720.

A single application of the feedback function as implemented in the feedback circuit 730 results in the generation of feedback signals such that immediately consecutively generated words (a predefined number of bits) at the outputs 710b of the registers 710 in response to the clock signal represent the change of states which involve in the case of a LFSR multiple clock cycles.

The feedback signals may only depend on the feedback function and the plurality of register output signals as shown in FIG. 7. Further parameters may not be required, although the feedback function itself may be programmable or provided to a feedback circuit 730.

Such a state machine 700 may enable a faster generation of a word stream since, because in each clock cycle, not just one feedback signal is generated, as in the case of a LFSR, also a plurality of feedback signals are generated with each provided to one of the registers 710.

The state machine 700 as shown in FIG. 7 may optionally comprise a circuit 750 coupled in between the outputs 710b of the registers 710 and the output 740 of the state machine 700. The circuit 750 may for instance be a circuit adapted to generate from the parallel provided output signals of the registers 710 a serial bit stream and provide same to the output 740 of the state machine 700.

Moreover, as indicated by a dashed arrow 760 the feedback circuit 730 may be programmable by providing a programming signal to an input 760 of the feedback circuit 730 so that the feedback circuit may depend on one or more parameters provided to the feedback circuit 730. This offers the opportunity to implement a generation of a bit stream being programmable. This may, for instance, be achieved on the basis of a modular-2 scalar product of a set of transitions matrix elements and the values of the register output signals as provided to the inputs 730a of the feedback circuit 730.

In summary, FIG. 7 shows a programmable state machine that generates multiple bits of a bit stream (e.g. the time-interleaved bit sequence) in one clock cycle.

The feedback function may be represented by a transition matrix. This transition matrix may also be called sub-rate transition matrix, since the state machine using this sub-rate transition matrix generates the time-interleaved bit sequence with a sub-rate in comparison to the generated full rate bit sequence. The feedback circuit 730 may comprise a storage unit containing the sub-rate transition matrix. Further, the register 710 may be configured to be initialized by a sub-rate initial state. The sub-rate transition matrix, as well as the sub-rate initial state, is based on the generating function and the initial state of the generating function of the bit sequence to be generated.

In summary, a bit sequence generator may comprise a state machine 700 for generating a word-stream, each word of the word-stream comprising a plurality of subsequence bits of a time-interleaved bit sequence. The state machine may comprise a plurality of clock registers and a feedback circuit. The plurality of clock registers may comprise corresponding inputs and corresponding outputs. Further, the feedback circuit 730 may be coupled to the inputs and to the outputs of the registers 710 and provide a plurality of feedback signals to the inputs of the registers based on the generating function and the plurality of register output signals of the registers, the register output signals being indicative of states of the registers. Additionally, the state machine 700 can be configured such that a first word defined by the plurality of register output signals comprises a first set of subsequent bits of the time-interleaved bit sequence and such that a subsequent second word defined by the plurality of register output signals comprises a second set of subsequent bits of the time-interleaved bit sequence.

Figure 8:
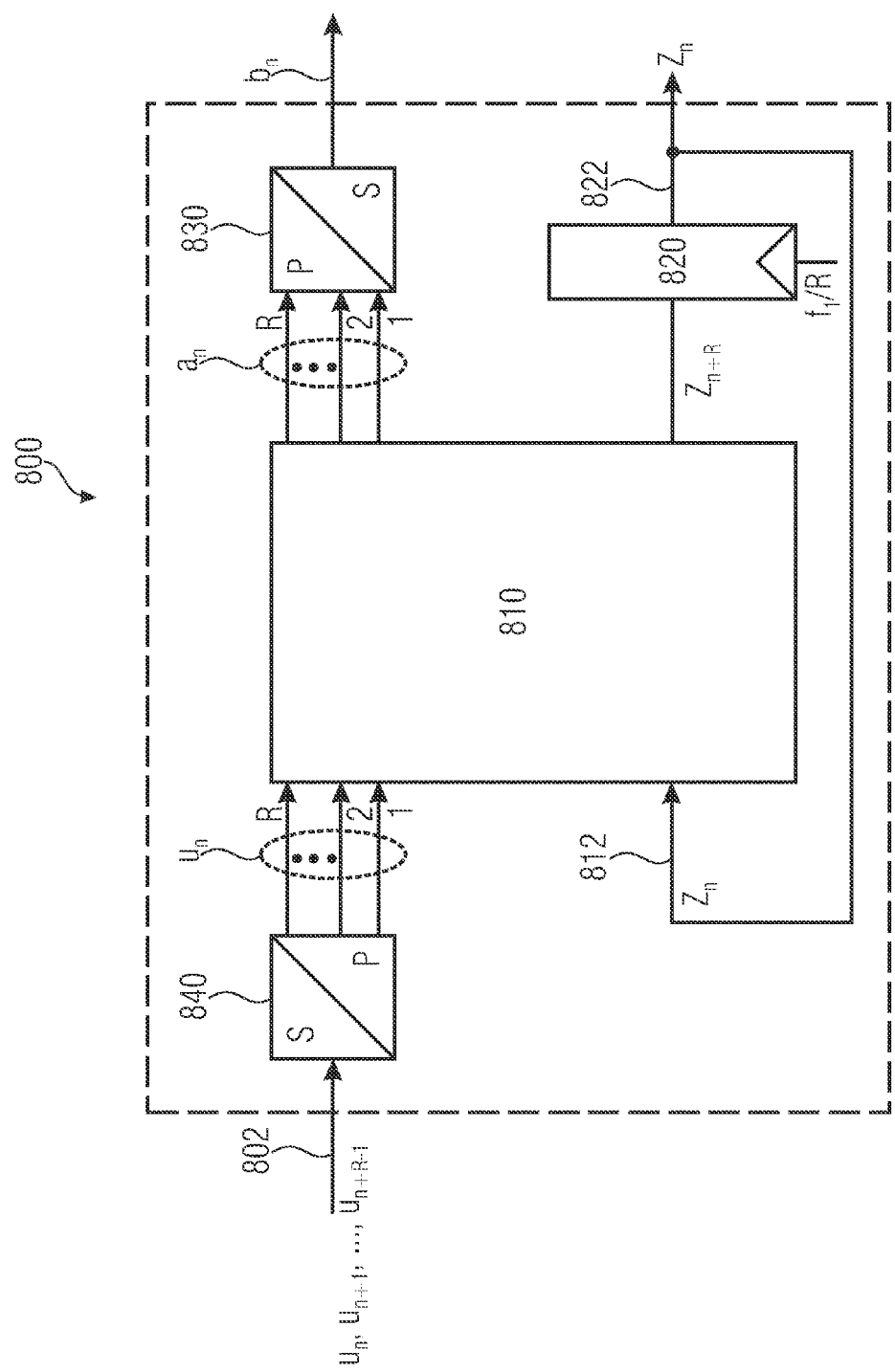
FIG. 8 is a block diagram of an exemplary state machine in accordance with an embodiment of the present disclosure.

FIG. 8 shows a further alternative implementation of a state machine. The state machine 800 comprises a first input 802 for an input signal $u_n$, wherein subsequent values of the input signal are being clocked to the input terminal 802 with a first clock rate $f_1$. Further, the apparatus 800 comprises a de-serializer 840 for converting the input signal $u_n$ to a sub-rate input signal $U_n$ wherein the sub-rate input signal $U_n$ is clocked into a sub-rate finite state machine circuit 810 with a second clock rate $f_2$ being a fraction of the first clock rate $f_1$. The de-serializer 840 may be, for example, a circuit for a serial-to-parallel conversion of the input signal $u_n$. Hence, the de-serialized sub-rate input signal $U_n$ may comprise R subsequent values $u_n, u_{n+1}, \ldots, u_{n+R-1}$ of the full-rate input signal, which are being clocked to the sub-rate FSM circuit 810 with the second clock rate $f_2$. The sub-rate FSM circuit 810, which may comprise a memory, in particular a RAM, or a programmable logic device or a programmable logic array (PLA), is configured to update a sub-rate internal state in dependence on a previous sub-rate internal state $z_n$ fed to the sub-rate FSM circuit 810 by means of a second input 812 and in dependence on the sub-rate input signal $U_n=[u_n, u_{n+1}, \ldots, u_{n+R-1}]$. Optionally, the sub-rate FSM circuit 810 may be configured to provide a sub-rate output signal $A_n$ in dependence on the previous or updated sub-rate internal state $z_n$, $z_{n+R}$. Thereby the sub-rate output signal $A_m$ comprises R signal values $v_m$, $v_{m+1}$, ..., $v_{m+R-1}$ that are fed into a serializer 830 in order to serialize the sub-rate output signal $A_m$ to obtain serial output signal $B_m$ having the first clock rate $f_1$. According to embodiments, the serializer circuit 830 may comprise a circuit for a parallel-to-serial conversion of the sub-rate output signal $A_m$ comprising R output signal values $a_m$, $a_{m+1}$, ..., $a_{m+R-1}$.

The sub-rate FSM circuit 810 acts on the inputs in the form of the sub-rate input signal $U_n$ [$u_n$, $u_{n+1}$, ..., $u_{n+R-1}$] and the previous sub-rate internal state $z_n$ and outputs the sub-rate output signal $A_n$=[$a_n$, $a_{n+1}$, ..., $a_{n+R-1}$] and an updated sub-rate internal state $z_{n+R}$, both with the second clock rate $f_2$. The updated sub-rate internal state $z_{n+R}$ is fed into a sub-rate internal state register 820, which may have a single output line 822 which may be divided into two routes. A first route can be coupled to another part of the system of which the sub-rate FSM is a sub-section, and a second route may be the state register output line 812.

According to some embodiments, the de-serializer 840 may be configured to serial-to-parallel-convert the input signal $u_n$, such that the sub-rate input signal $U_n$ comprises, within a time interval $T_2$ (being inverse to the second clock rate $f_2$, i.e. $T_2=1/f_2$), a plurality of subsequent values $u_n$, $u_{n+1}$, ..., $u_{n+R-1}$ of the input signal corresponding to a plurality of subsequent time intervals $T_1$, where the intervals may be inverse to the first clock rate $f_1$, i.e. $T_1=1/f_1$.

Alternatively, the input signals may only be used to program the sub-rate finite state machines circuit 810. For example, the matrix elements of a sub-rate transition matrix can be provided to a storage unit of the sub-rate finite state machine circuit 810. In this example, the de-serializer 840 is only an optional part and the input signal may be provided with the clock rate or bitrate independent from the clock rate of the output signal or the clock rate with which the sub-rate finite state machine circuit 810 is operated. The output signal of the serializer 830 may, for example, be the time-interleaved bit sequence to be generated by the state machine 800. Alternatively, the time-interleaved bit sequence may be obtained from the output line 822 of the sub-rate internal state register 820 only, or in combination with the output signal of the serializer 830.

In other words, a bit sequence generator may comprise a state machine comprising an input 802 for an intermediate input signal having a first clock rate, a deserializer 840 for converting the intermediate rate input signal to a sub-rate input signal having a second clock rate being a fraction of the first clock rate, a sub-rate finite state machine 810 and a serializer 830. The sub-rate finite state machine 810 can update a sub-rate internal state in dependence on a previous sub-rate internal state and the sub-rate input signal, and provide a sub-rate output signal in dependence on the previous or updated sub-rate internal state.

Further, the serializer 830 can serialize the sub-rate output signal to obtain an intermediate rate output signal having the first clock rate, wherein the sub-rate finite state machine 810 can be configured to update the sub-rate internal state as the second clock rate.

More general, depending on the implemented state machine, a bit of the time-interleaved bit sequence may be equal to a state bit of the state machine or not. In other words, in some embodiments of the disclosure, a state machine may generate a bit of the time-interleaved bit sequence for a current time step based on at least one bit of the time-interleaved bit sequence generated by the state machine for a preceding time step.

Similar to the implementation shown in FIG. 7, the state machine 800 may generate the time-interleaved bit sequence based on sub-rate transition matrix and a sub-rate initial state, both derived from the generating function and the initial state of the generating function. The transition matrix may be stored by the sub-rate finite state machine circuit 810, and the sub-rate internal state register 820 may be initialized with the sub-rate initial state.

The sub-rate transition matrix and the sub-rate initial state may be different for all state machines of the plurality of state machines of the bit sequence generator described above. Alternatively, all state machines may generate their time-interleaved bit sequence based on the same sub-rate transition matrix, but based on different sub-rate initial states. This may be possible, since the underlying generating function and initial state may be the same for all state machines.

Figure 2:
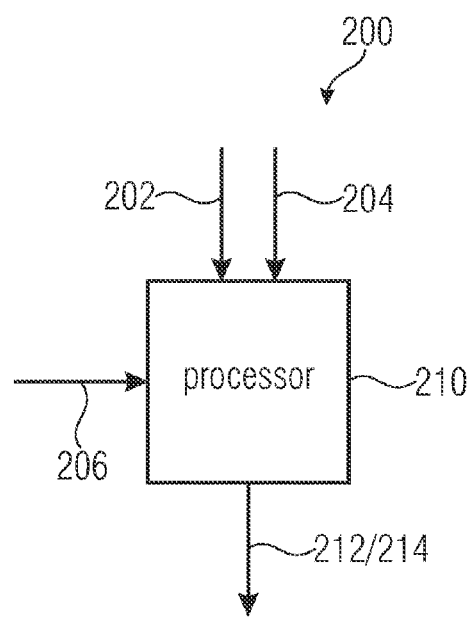
FIG. 2 is a block diagram of an exemplary apparatus for calculating a sub-rate transition matrix and a sub-rate initial state for a state machine of the plurality of state machines.

As mentioned above, the sub-rate transition matrix and the sub-rate initial state for each state machine of the plurality of state machines may be derived from the generation function and the initial state of the generating function. FIG. 2 shows a block diagram of an apparatus 200 for calculating a sub-rate transition matrix 212 and a sub-rate initial state 214 for a state machine of a plurality of state machines according to an embodiment of the disclosure. The apparatus 200 comprises a processor 210. This processor 210 calculates the sub-rate initial stage 214 for the state machine based on a generating function 202 of a full rate bit sequence, an initial state 204 of the generating function 202 and a number of state machines 206 of the plurality of state machines. Further, the processor 210 calculates the sub-rate transition matrix 212 for the state machine based on the generating function 202 and the number of state machines 206.

Such a sub rate transition matrix 212 and sub-rate initial state 214 may be calculated for each state machine of the plurality of state machines. In this manner, the plurality of state machines may be able to generate time-interleaved bit sequences for an arbitrary generating function and initial state, which can be merged by a multiplexer to obtain the full bitrate bit sequence defined by the generating function and the initial state, for example.

The sub rate transition matrix and the sub rate initial state for the state machine may be calculated independent from a bit sequence generator. The sub rate transition matrix and the sub rate initial state may be stored by a storage device and used later on by a plurality of bit sequence generators. The apparatus 200 may only need to know the number of state machines of the plurality of state machines of a bit sequence generator using the sub rate transition matrix and the sub rate initial state later on.

In this manner, a bit sequence with a very high bitrate can be generated, although the state machines are operated with a significantly lower clock rate. In other words, the state machines can provide the time-interleaved bit sequences using a significantly lower bitrate than the full rate bit sequence to be generated.

In contrast to the calculation of the sub-rate initial state, the sub-rate transition matrix may, for instance, be determined independent from the initial state of the generating function. In this case, the sub-rate transition matrix may be equal for all state machines of the plurality of state machines. The output of the state machines may then only differ due to different sub-rate initial states determined for the state machines. In other words, the processor 210 may calculate the sub-rate initial state for each state machine of the plurality of state machines, so that the calculated sub-rate initial states are different from each other. Further, the processor may calculate the sub-rate transition matrix, so that the sub-rate transition matrix is the same for all state machines of the plurality of state machines. In other words, the same sub-rate transition matrix can be used by all state machines.

The sub-rate transition matrix may be calculated for each state machine of a pseudorandom bit sequence generator as, for example shown in FIG. 1. The bit sequence generator may output the same bit sequence than a single state machine using a full rate transition matrix based on the generating function. Therefore, the sub-rate transition matrix for a state machine of the plurality of state machines may be derived from such a full rate transition matrix. In other words, the processor may determine a full rate transition matrix based on the generating function and may calculate the sub-rate transition matrix based on the full rate transition matrix and the number of state machines. Further, the calculator may calculate the sub-rate initial state based on the full rate transition matrix, the initial state of the generating function and the number of state machines.

The sub-rate transition matrix may be, for example, a square matrix with a predefined number of rows. For example, the predefined number of rows may be set depending on a maximum size of the transition matrix, which can be stored by a storage unit of the state machine, or a maximal calculation time that may be taken a state machine for generating bits of the time-interleaved bit sequence based on the sub rate transition matrix. The predefined number of rows of the sub-rate transition matrix may be equal to, or larger than an order of the generating function. For example, for a polynomial generating function, the order of the polynomial indicates the number of coefficients that may be used to define the generating functions as mentioned above. Therefore, the sub-rate transition matrix may comprise at least a number of rows equal to the number of coefficients that may be used to define the generating function.

The processor 210 may be realized, for example, as an independent hardware unit, a part of a computer or microcontroller as well as a computer program or software product configured to run on a computer or micro-controller.

Figure 3:
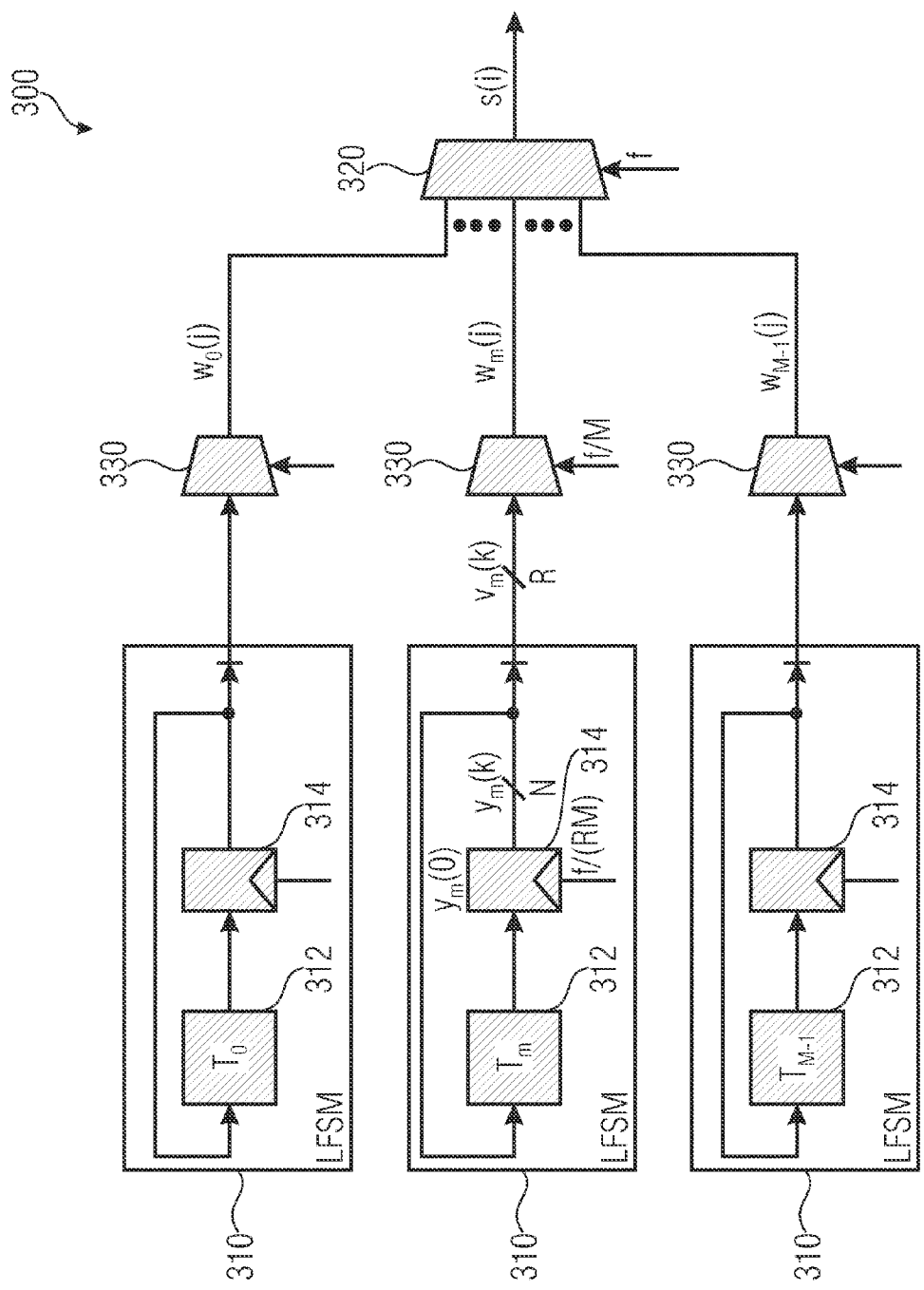
FIG. 3 is a block diagram of an exemplary bit sequence generator in accordance with an embodiment of the present disclosure.

In the following, an example for calculating the sub-rate transition matrix and the sub-rate initial states for a plurality of state machines, will be explained in more detail. This can be done based on a hardware implementation of a pseudorandom bit sequence generator 300 shown in FIG. 3 representing the inventive concept. Although, FIG. 3 shows three state machines 310 representing the plurality of state machines, a pseudorandom bit sequence generator may also be realized with two, or more than three, state machines. Each state machine 310 can be connected to a serializer 330 and each serializer 330 being connected to the multiplexer 320. Further, each state machine 310 may comprise a feedback circuit 312 and one or more clocked state registers 314. The feedback circuit 312 can be connected to the state registers 314, with the state registers 314 being connected with an output to an input of the feedback circuit 312 and to an input of the associated serializer 330. The pseudorandom bit sequence generator 300 represents an example of a target architecture with M time-interleaved bitstreams $w_m(j)$, each serialized from outputs of state machines, in this connection also called sub-rate linear finite state machines, at rate $f/(R \cdot M)$.

In the illustrated architecture (FIG. 3), the same sequence $\{s(i)\}$ with bit rate f shall be generated by time-interleaving (multiplexing) M bit streams $w_m(j)$, $m=0, 1, \ldots, M-1$ with bit rate $f/M$, each generated by further serializing R bit wide words $v_m(k)$, which are outputs of sub-rate linear finite state machines (LFSM), running at rate $f/(R \cdot M)$. M indicates an individual number of each state machine or each time-interleaved bit sequence. This individual number may determine the order for selecting the different time-interleaved bit sequences. For example, the multiplexer may select first a bit from the time-interleaved bit sequence generated by the state machine with the individual number m=0, followed by selecting a bit from the time-interleaved bit sequence generated by the state machine with the individual number m=1 and so on.

All M LFSMs have, for example, a programmable N×N expanded state transition matrix $T_m$ (sub rate transition matrix) and a programmable initial expanded state $y_m(0)$ (sub rate initial state). Since there is no dedicated output matrix in this example, the expanded state $y_m \in B^N$ includes the outputs as well as the state $z_m \in B^P$, $P \leq N$ which uniquely identifies all reachable $y_m$, hence the term expanded state.

One goal is to compute the expanded state transition matrices $T_m \in B^{N \times N}$ and the initial expanded states $y_m(0) \in B^N$, $m=0, 1, \ldots, M-1$ of the M time-interleaved LFSMs as a function of the PRBS polynomial $g(x)$ (generating function), the number M of time-interleaved bit streams (number of state machines), and the rate reduction factor R and to give conditions when this computation is used.

It will be shown that for N=32, M=2, and R∈{4,8,12,16, 20,24,28,32}, a solution exists for all polynomials with degree P≤N.

For example, Patent applications "J. Rivoir: State machine and generator for generating a description of a state machine feedback function, WO 2010034326 A1" and "J. Rivoir: Apparatus and method for emulating a full-rate finite state machine, WO 2010034327 A1" address the generation of multiple bits of an arbitrary (non-linear) FSM in one clock cycle. However the number of elements in the state transition matrix of the subrate LFSM grows quadratically with the subrate factor. The present disclosure proposes time-interleaving multiple bit streams and therefore may involve only linearly increasing HW effort. However the approach can only emulate the output of an autonomous linear FSM, which is not a restriction for the generation of PRBS.

In the following, a matrix approach in GF(2) is used and thus avoids reference to the abstract notion of a factorial ring $g(x) \in B^P[x]/(x^P-1)$. A thorough treatment of LFSR and related mathematical concepts can be found in "A. Neubauer, J. Freudenberger, V. Kühn: *Coding Theory—Algorithms, Architectures and Applications*, Wiley 2007" and "D. S. Dummit, R. M. Foote: *Abstract Algebra*, Wiley 2004".

The output sequence $\{s(i)\}$ of a LFSR repeats after L steps. When $g(x)$ is a so-called primitive polynomial, the sequence length is maximal, i.e. $L=L_{max}=2^P-1$, otherwise L is a divider of $L_{max}$. As a divider of an odd number $L_{max}$, L is also odd.

$$L \text{ is odd.} \qquad (2)$$

From now on, a maximum length sequence, i.e. a primitive polynomial, will be assumed. A general boolean LFSM of order P and one output $s(i)$ has state equations of the form:

$$x(0)=x_0 \in B^P$$

$$x(i+1)=G \cdot x(i), i=0,1,2,\ldots,$$

$$s(i)=c' \cdot x(i) \qquad (3)$$

where operations are conducted in the binary Galois field, GF(2), i.e. logical XOR is used as 'summation' and logical AND as 'multiplication'. '·' denotes the inner matrix product and is omitted at times. $x_0$ is the initial state of the generating function, G is the full rate transition matrix and s(i) is the bit sequence to be generated.

With the usual state numbering $$x=(x_1,x_2,\ldots,x_P)' \in B^P, \quad (4)$$

the state transition matrix (full rate transition matrix) is $$G = \begin{pmatrix} g_1 & g_2 & \cdots & g_{P-1} & g_P \\ 1 & 0 & \cdots & 0 & 0 \\ 0 & 1 & \ddots & \vdots & \vdots \\ \vdots & \ddots & \ddots & 0 & 0 \\ 0 & 0 & & 1 & 0 \end{pmatrix}, \quad (5)$$

also known as the top companion matrix of the coefficient vector (with coefficients $g_1, \ldots, g_P$)

$$g=(g_1,g_2,\ldots,g_P)' \in B^P \quad (6)$$

of the generating polynomial g(x) (generating function). Because the output s equals the last state variable, the output vector becomes the P-th unit row vector $$c' = e'_P = (0,0,\ldots,0,1) \in B^P. \quad (7)$$

Iteratively applying (3) yields state and output in the i-th time step.

$$x(i) = G^i x_0$$

$$s(i) = e'_P G^i x_0 \quad (8)$$

Because all states repeat after exactly $L=L_{max}=2^P-1$ time steps $$x(L+i) = G^{L} x(i), \quad (9)$$

the P×P state transition matrix G is cyclic.

$$G^L = I \quad (10)$$

Please note that property (10) is not sufficient for cyclicity of a matrix. $G^i x$, $i=0, 1, \ldots, L-1$ may also form a basis of $B^P$, as in this embodiment, as x goes through all $L=L_{max}=2^P-1$ non-zero states in $B^P$.

The intended PRBS {s(i)} can be generated by time-interleaving M bit streams $w_m(j)$ in the order m={0, 1, ..., M−1, 0, 1, ...} and therefore can be constructed as $$w_m(j) = s(m+j \cdot M), \quad (11)$$

for j=0, 1, 2, ... and m=0, 1, ..., M−1. Because $w_m(j)$ are serialized from the R elements of $v_m(k)$ in the order r=1, 2, ..., R, see FIG. 3, the latter may contain R consecutive values of $w_m(j)$ $$v_m(k) = \begin{pmatrix} w_m(kR) \\ w_m(kR+1) \\ \vdots \\ w_m(kR+R-1) \end{pmatrix}, \quad (12)$$

for k=0, 1, 2, ... and with (11)

$$v_m(k) = \begin{pmatrix} s(m+kMR) \\ s(m+kMR+M) \\ \vdots \\ s(m+kMR+(R-1)M) \end{pmatrix}. \quad (13)$$

Further, a state coding and outputs may be chosen. LFSMs with a sequence length of $L_{max}=2^P-1$ may use at least P state bits. When M shares no common divider with the sequence length, each time-interleaved LFSM (state machine of the plurality of state machines) can go through all $L_{max}$ states and therefore also needs a state vector with P elements, $z_m \in B^P$. This leads to the first (obvious) requirement Requirement 1: $P \leq N$ (14)

Note, in case M does share a divider with L, each LFSM must generate only L/gcd(M,L) different states and therefore needs only $\hat{P} = \lceil \log_2(L/\gcd(M,L)) \rceil$ state bits to represent those states.

To simplify the derivation, the practically relevant case with even M, which therefore shares no common divider with the odd L, see (2), will now be assumed.

Requirement 2: gcd(M,L)=1 (15)

The state coding can now be chosen such that the R elements of $v_m(k)$ are identical to the first P state bits, at least if R≤P. The chosen state coding follows pattern (13)

$$z_m(k) = \begin{pmatrix} s(m+kMR) \\ s(m+kMR+M) \\ \vdots \\ s(m+kMR+(P-1)M) \end{pmatrix}. \quad (16)$$

To accommodate the case where R is larger than P, all available N outputs $y_m \in B^N$ are chosen according to the same pattern $$y_m(k) = \begin{pmatrix} s(m+kMR) \\ s(m+kMR+M) \\ \vdots \\ s(m+kMR+(N-1)M) \end{pmatrix}, \quad (17)$$

obviously assuming

Requirement 3: $R \leq N$ (18)

This choice allows sharing equations between next states and outputs, which is useful since the target architecture does not feature a non-trivial output matrix.

$$v_m(k) = V \cdot y_m(k), \quad (19)$$

with $$V = (I_R \; 0_{R \times (N-R)}). \quad (20)$$

Note, unlike a state machine of as shown in FIG. 5 that outputs the P-th element of the state vector, following general LFSR notation, the above state machine outputs the first R state elements. This numbering makes index arithmetic easier.

$z_m(k)$ can be computed from state coding (16) and equations (8)

$$z_m(k) = \begin{pmatrix} e'_P G^{m+kMR} x_0 \\ e'_P G^{m+kMR+M} x_0 \\ \vdots \\ e'_P G^{m+kMR+(P-1)M} x_0 \end{pmatrix} = \begin{pmatrix} e'_P \\ e'_P G^M \\ \vdots \\ e'_P G^{(P-1)M} \end{pmatrix} G^{kMR} G^m x_0, \quad (21)$$

or in short $$z_m(k) = Q_P G^{kMR} x(m), \text{ where} \tag{22}$$

$$Q_P = \begin{pmatrix} e'_P \\ e'_P G^M \\ \vdots \\ e'_P G^{(P-1)M} \end{pmatrix} \in B^{P \times P} \tag{23}$$

can be identified as the (square) observability matrix of a LFSM with P×P state transition matrix $G^M$, i.e. a LFSM of order P that progresses by M time steps of the LFSR G in one cycle, and the output being the last state.

Now, non-singularity of $Q_P$ will be shown. The main theorem in "J. Jordan: *Controllability of polynomial-shift inverse iteration*, Proceedings of the Benelux Meeting on Systems and Control, Helvoirt, The Netherlands, 17.-19. Mar. 2004" states that a system is controllable if and only if its system matrix is cyclic. Assuming gcd(M,L)=1, $G^M$ is indeed cyclic, because G is cyclic. Due to the duality principle, an analog statement applies to observability, which implies full rank of the observability matrix, or in this case, non-singularity of the square matrix $Q_P$.

This allows solving (22) for $G^{kMR} x(m)$:

$$G^{kMR} x(m) = Q_P^{-1} z_m(k) \tag{24}$$

The state equations for $z_m(k)$ can be derived by applying time step k+1 to (22) and using the above result (24).

$$z_m(k+1) = Q_P G^{(k+1)MR} x(m) = Q_P G^{MR} \cdot G^{kMR} x(m) \tag{25}$$

$$= Q_P G^{MR} Q_P^{-1} \cdot z_m(k)$$

With state transition matrix $$S = Q_P G^{MR} Q_P^{-1} \tag{26}$$

and the initial state from k=0 in (22), the state equations become $$z_m(0) = Q_P \cdot x(m)$$

$$z_m(k+1) = S \cdot z_m(k). \tag{27}$$

Because (26) links S and $G^{MR}$ through a similarity transform, the states $z_m(k)$ progress by MR LFSR steps in each cycle k.

Similarly to (21), (22), (23), and with (24), the output equation can be written as $$y_m(k+1) = Q_N G^{kMR} x(m) \tag{28}$$

$$= Q_N G^{MR} Q_P^{-1} z_m(k)$$

with $$Q_N = \begin{pmatrix} e'_P \\ e'_P G^M \\ \vdots \\ e'_P G^{(N-1)M} \end{pmatrix} \in B^{N \times P}. \tag{29}$$

For a LFSM with implicit outputs, as shown in FIG. 3 these state and output equations may be mapped to the structure of FIG. 3, which does not include a dedicated output matrix.

The N elements of $y_m(k)$ can be viewed as an expanded state vector, because the P elements of state vector $z_m(k)$ equal the first P elements of $y_m(k)$ $$z_m(k) = (I_P \, 0_{P \times (N-P)}) \cdot y_m(k), \tag{30}$$

where $I_P$ denotes the P×P identity matrix. Output equation (28) can now be rewritten as (expanded) state equation.

$$y_m(k+1) = Q_N G^{MR} Q_P^{-1} (I_P \, 0_{P \times (N-P)}) y_m(k) \tag{31}$$

$$= (Q_N G^{MR} Q_P^{-1} \, 0_{N \times (N-P)}) y_m(k)$$

It is worth noting that the N×N state transition matrix of the expanded system (sub rate transition matrix)

$$T = (Q_N G^{MR} Q_P^{-1} \, 0_{N \times (N-P)}) \tag{32}$$

does not depend on m. Together with the initial state (sub rate initial state) from (28)

$$y_m(0) = Q_N \cdot x(m), \tag{33}$$

the final LFSR with combined state and output $y_m(k)$ becomes $$y_m(0) = Q_N \cdot x(m)$$

$$y_m(k+1) = T \cdot y_m(k). \tag{34}$$

The detour via $z_m(k)$ was useful, because $Q_N$ is generally not a square matrix, and therefore does not possess an ordinary inverse, as opposed to just a pseudo-inverse.

The proposed concept provides, for example, a method for generating high-speed PRBS, based on time-interleaving slower bit-streams that are generated by further serialized outputs of programmable LFSMs.

An apparatus for calculating a sub-rate transition matrix and a sub-rate initial state for a state machine of a plurality of state machines can be realized independent from a pseudorandom bit sequence generator, since only some hardware parameters (e.g. the number of state machines of the plurality of state machines) of a target bit sequence generator may be useful to calculate the sub-rate transition matrix and the sub-rate initial state for the state machines. The sub-rate transmission matrix and the sub-rate initial states may be stored by a storage unit and may be transferred to the state machines of the pseudorandom bit sequence generator later on. In this way, for example, transition matrices and sub-rate initial states for a plurality of different generating functions and/or initial states may be determined and stored. This stored data may then be used from a plurality of pseudorandom bit sequence generators comprising the same hardware.

Correspondingly, a bit sequence generator according to the present disclosure may be implemented independent from an apparatus for calculating a sub-rate transition matrix and a sub-rate initial state for the state machines of the plurality of state machines, since the transition matrix and the sub-rate initial states for the state machines may be stored and provided by a storage unit for one or more generating functions.

Figure 4:
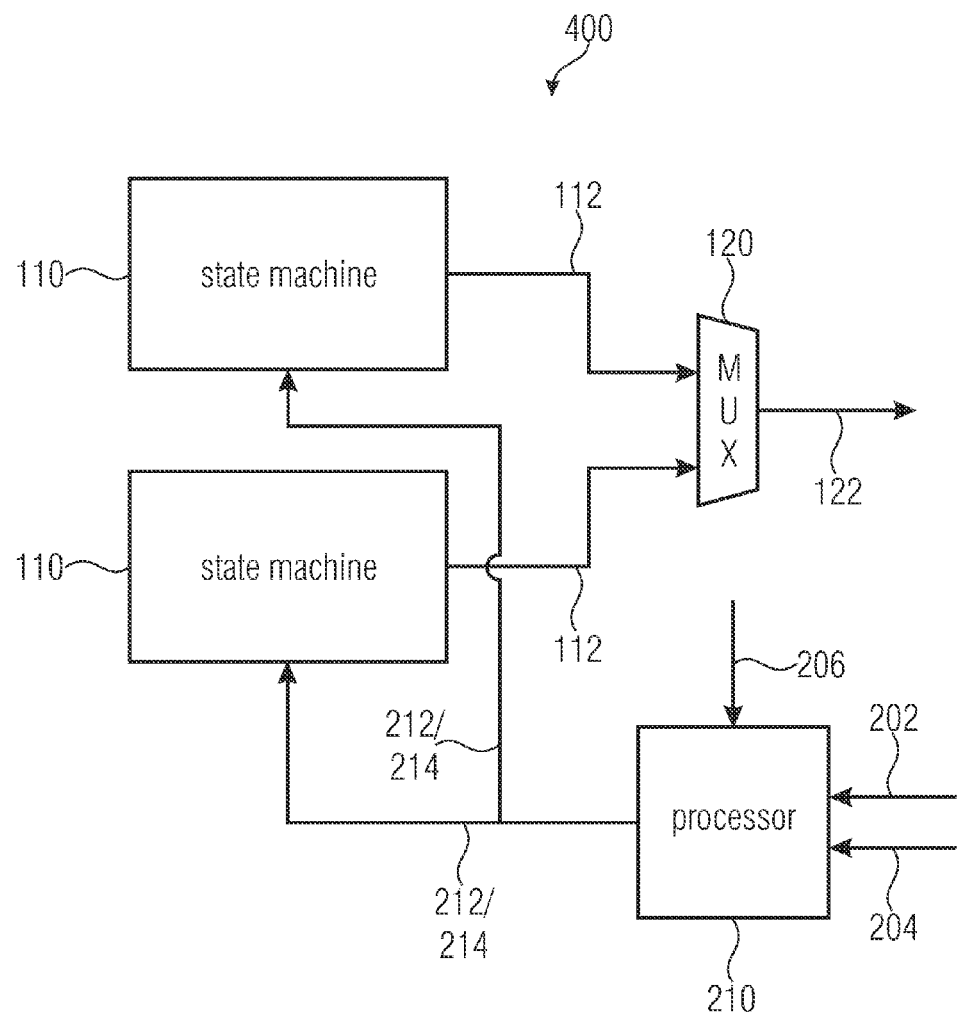
FIG. 4 is a block diagram of an exemplary pseudorandom bit sequence generator comprising an apparatus for calculating a sub-rate transition matrix and a sub-rate initial state in accordance with an embodiment of the present disclosure.

However, for example, if a user wants to define individual generating functions and/or initial states, then a combination of a bit sequence generator and an apparatus for calculating a sub-rate transition matrix and a sub-rate initial state for the state machines of the plurality of state machines may be used. FIG. 4 shows a block diagram of a bit sequence generator 400 comprising an apparatus for calculating a sub-rate transition matrix and a sub-rate initial state for a state machine of the plurality of state machines according to an embodiment of the disclosure. Similar to the pseudorandom bit sequence generator shown in FIG. 1, the pseudorandom bit sequence generator 400 comprises two state machines 110 connected to a multiplexer 120. Further, the bit sequence generator 400 comprises the processor 210 of the apparatus for calculating the sub-rate transition matrix 212 and the sub-rate initial state 214 connected to the state machines 110. The processor 210 can calculate the sub-rate transition matrix 212 and the sub-rate initial states 214 and provides them to the state machines 110. The state machines 110 can generate the corresponding time-interleaved bit sequences 112 based on the provided sub-rate transition matrix 212 and the sub-rate initial states 214. These time interleave bit sequences 112 can be merged by the multiplexer 120, so that the bit sequence 122 defined by the generating function and the initial state is provided with the full rate.

Some embodiments according to the disclosure relate to an automated test equipment comprising a bit sequence generator and/or and apparatus for calculating a sub-rate transition matrix and a sub-rate initial state for a state machine of the plurality of state machines as described above.

An implementation of a bit sequence generator comprising independent state machines 110 has the advantage for an automated test equipment that independent test channels of the automated test equipment can be used for the realization of the state machines. In other words, it can implement a bit sequence generator capable of providing a very fast bit sequence (e.g. pseudorandom bit sequence) only by adding a multiplexer and providing a sub rate transition matrix and sub rate initial states for the state machines of the plurality of state machines according to the described concept.

Some embodiments according to the disclosure relate to a pseudorandom bit sequence generation using time-interleaved sub-rate state machines.

For this, the proposed concept explains, for example, the theory behind the generation of a 12.8 Gbps PRBS (or another bit rate). Because generation of a 12.8 Gbps PRBS using an at-speed LFSR is technologically extremely challenging, for example, this concept proposes time-interleaving, for example, the 6.8 Gbps outputs of two (M=2) cores, each containing a programmable linear finite state machine (LFSM) of order N that runs at a further fraction 1/R of the 6.8 Gbps output. Equations for the initial state and subsequent states of the sub-rate state machines may be derived as a function of the generating polynomial of degree P, the number of interleaved bit streams M and the rate reduction factor R.

For example, the present disclosure may solve the problem that direct generation of pseudorandom bit sequences using at-speed linear feedback shift registers is difficult (e.g. at 12.8 Gbps). This will also increase in future for 20 Gbps, 40 Gbps, 100 Gbps, or more, especially when polynomial (the generating function) shall be programmable. The present disclosure allows to use a slower running logic (state machine). It may work for outputs of any linear finite state machines, not just pseudorandom bit sequences. Polynomial can also be non-primitive, because L (number of bits after which the output sequence repeats) is still odd. M (number of state machines of the plurality of state machines) can also be a divider of L. The present disclosure may work with a dedicated output matrix also, which can make everything easier in this case.

According to the present disclosure, the output of the multiple state machines or linear feedback shift registers can be time-interleaved, such that the combined output equals the output of the single linear feedback shift register providing a bit sequence defined by the generating function and the initial state.

In other words, in some embodiments, no additional hardware beyond a multiplexer may be needed. Further, the present disclosure may leverage existing lower speed pseudorandom bit sequence generators. Thus, a bit sequence generator according to the present disclosure may have no additional hardware complexity, no additional power consumption, and may scale to even higher speeds and/or any polynomial can be generated. In other words, a generation of a 12.8 Gbps (or even more) pseudorandom bit sequence with a programmable polynomial may be advantageously enabled.

Figure 9:
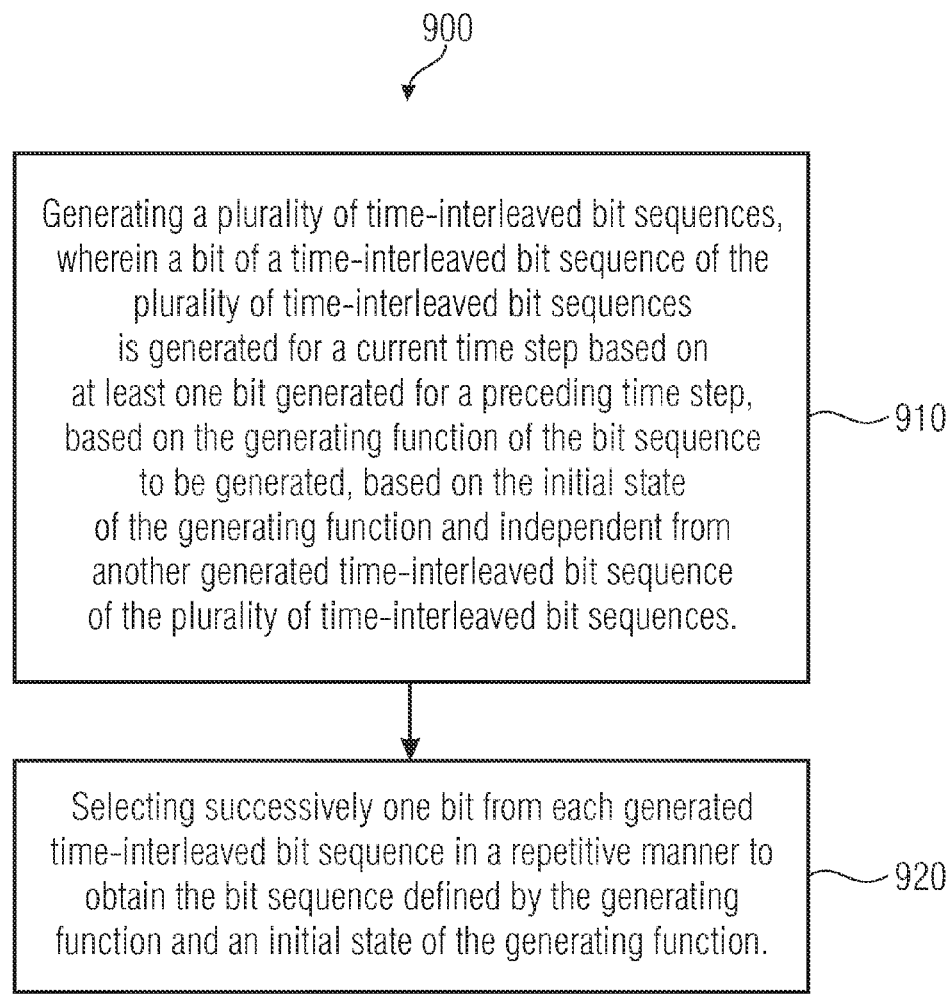
FIG. 9 is a flowchart of an exemplary method for generating a bit sequence in accordance with an embodiment of the present disclosure.

FIG. 9 shows a flowchart of a method 900 for generating a bit sequence defined by a generating function and an initial state of the generating function according to an embodiment of the disclosure. The method 900 comprises generating 910 a plurality of time-interleaved bit sequences and selecting 920 successively one bit from each generated time-interleaved bit sequence in a repetitive manner to obtain the bit sequence defined by the generating function and the initial state of the generating function. A bit of the time interleave bit sequence generated for a current time step may be based on at least one bit generated (e.g. for this time-interleaved bit sequence) for a preceding time step, the generating function of the bit sequence to be generated, and the initial state of the generating function and independent from another generated time-interleaved bit sequence.

The method 900 may comprise further steps corresponding to the features of the bit sequence generator described above.

Figure 10:
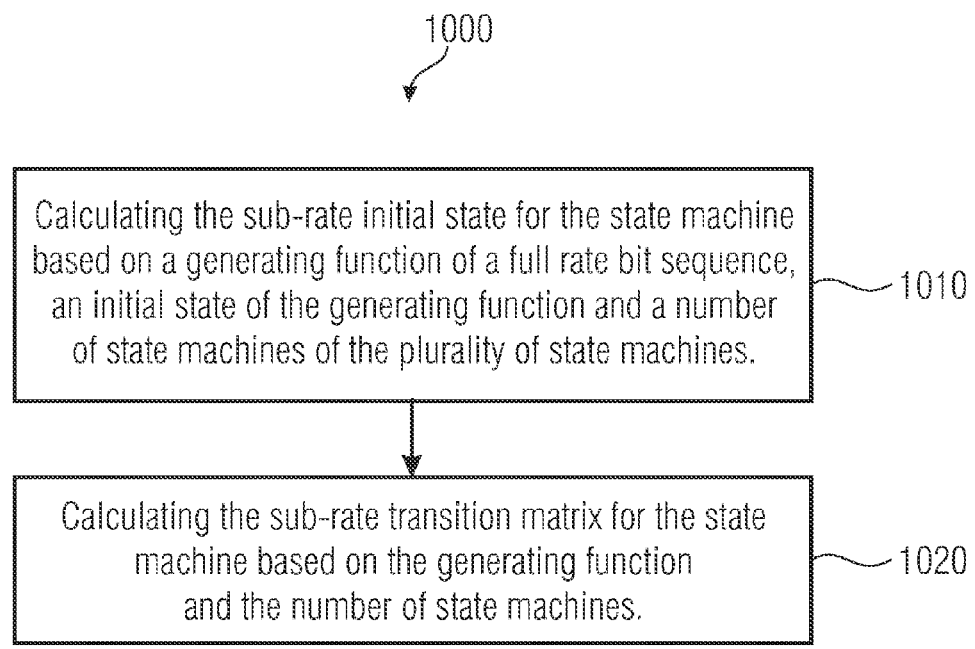
FIG. 10 is a flowchart of an exemplary method for calculating a sub-rate transition matrix and a sub-rate initial state for a state machine of the plurality of state machines in accordance with an embodiment of the present disclosure.

FIG. 10 shows a flowchart of an exemplary method 1000 for calculating a sub-rate transition matrix and a sub-rate initial state for a state machine of a plurality of state machines according to an embodiment of the disclosure. The method 1000 comprises calculating 1010 the sub-rate initial state for the state machine and calculating 1020 the sub-rate transition matrix for the state machine. The sub-rate initial state can be calculated 1010 based on a generating function of a full rate bit sequence, an initial state of generating function and a number of state machines of the plurality of state machines. Further, the sub-rate transition matrix can be calculated 1020 based on the generating function and a number of state machines.

The method 1000 may comprise of further steps corresponding to the features of the apparatus, such as for calculating a sub-rate transition matrix and a sub-rate initial state for a state machine of a plurality of state machines described above.

Although some aspects of the described concept have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the present disclosure can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the present disclosure comprise a data carrier having electronically readable control signals, which are capable of cooperating with a programmable computer system, such that one of the methods described herein is performed.

Generally, embodiments of the present disclosure can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods can be performed by any hardware apparatus.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

The invention claimed is:

1. A bit sequence generator comprising:
a multiplexer configured to output an output bit sequence by successively selecting a respective bit of the output bit sequence from a plurality of time-interleaved bit sequences, wherein the output bit sequence is defined by a generating function and an initial state of the generating function; and
a plurality of state machines coupled with the multiplexer and configured to generate the plurality of time-interleaved bit sequences, wherein each of the plurality of state machines is configured to generate a respective time-interleaved bit sequence of the plurality of time-interleaved bit sequence during a time step,
wherein a first state machine of the plurality of state machines is configured to generate a first time-interleaved bit sequence of the plurality of time-interleaved bit sequences by generating a respective bit of the first time-interleaved bit sequence during a corresponding time step based on a) at least one preceding bit generated by the first state machine during a preceding time step b) the generating function, and c) the initial state of the generating function, and independent from another time-interleaved bit sequence generated by another state machine of the plurality of state machines, wherein first time-interleaved bit sequence is generated in a first sub bit rate,
wherein further the first state machine comprises a serializer that is configured to: serialize a state sequence of the first respective state machine; select a respective bit of the first time-interleaved bit sequence from the state sequence; and provide the first time-interleaved bit sequence in a serial manner with an intermediate bit rate, wherein the intermediate bit rate is equal to the first sub bit rate multiplied with a first predefined number of bits of the first time-interleaved bit sequence.

2. The bit sequence generator according to claim 1, wherein each respective time-interleaved bit sequence of the plurality of time-interleaved bit sequences comprises the first predefined number of bits.

3. The bit sequence generator according to claim 2, wherein each respective time-interleaved bit sequence is generated in the first sub bit rate, wherein the multiplexer is configured to generate the output bit sequence with a full bit rate being equal to an integer multiple of the first sub bit rate.

4. The bit sequence generator according to claim 3, wherein the integer multiple is equal to a product of the first predefined number and a number of state machines of the plurality of state machines.

5. The bit sequence generator according to claim 2, wherein a respective state of each respective state machine of the plurality of state machines is defined by a respective state sequence that comprises a second predefined number of state bits, wherein each respective state sequence is generated by a respective state machine during a time step in a parallel manner, wherein each respective state sequence comprises a respective time-interleaved bit sequence.

6. The bit sequence generator according to claim 1, wherein a second state machine of the plurality of state machines is configured to generate a second time-interleaved bit sequence of the plurality of time-interleaved bit sequences based on a first sub-rate transition matrix and a first sub-rate initial state, wherein the first sub-rate transition matrix and the first sub-rate initial state are based on the generating function and the initial state of the generating function.

7. The bit sequence generator according to claim 6, wherein a third state machine of the plurality of state machines is configured to generate a third time-interleaved bit sequence of the plurality of time-interleaved bit sequences based on a second sub-rate transition matrix and a second sub-rate initial state, wherein the first and the second sub-rate transition matrixes are the same, and wherein the first and the second sub-rate initial states are different.

8. The bit sequence generator according to claim 1, wherein the output bit sequence comprises a pseudorandom bit sequence.

9. The bit sequence generator according to claim 1 further comprising a circuit operable to calculate a first sub-rate transition matrix and a first sub-rate initial state for a second state machine of a plurality of state machines, wherein the circuit comprises a processor configured to: calculate a first sub-rate initial state based on the generating function, the initial state of the generating function, and a number of state machines of the plurality of state machines, and wherein the processor is further configured to calculate the first sub-rate transition based on the generating function, and the number of state machines.

10. The bit sequence generator according to claim 9, wherein the processor is further configured to:
   determine a full rate transition matrix based on the generating function;
   calculate the first sub rate transition matrix based on the full rate transition matrix and the number of state machines; and
   calculate the first sub-rate initial state based on the full rate transition matrix, the initial state of the generating function and the number of state machines.

11. The bit sequence generator according to claim 9, wherein the processor is further configured to calculate a second sub-rate initial state for a third state machine of the plurality of state machines, wherein second third sub-rate initial state is different from the first sub-rate initial state.

12. The bit sequence generator according to claim 9, wherein the processor is further configured to calculate a uniform sub-rate transition matrix for the plurality of state machines.

13. The bit sequence generator according to claim 9, wherein the generating function comprises a polynomial function with an order of P, wherein the first sub-rate transition matrix is a square matrix with a second predefined number of rows, wherein the second predefined number is equal to, or larger than P.

14. The bit sequence generator according to claim 9, wherein the processor is further configured to calculate the first sub-rate transition matrix according to $$T = (Q_N G^{MR} Q_P^{-1} 0_{N \times (N-P)}),$$

wherein N is a number of rows of T, M is the number of state machines of the plurality of state machines, P is the order of the generating function, G is a full rate transition matrix and R is a number of bits of a bit sequence generated by the second state machine during a time step using the first sub rate transition matrix, wherein $$Q_N = \begin{pmatrix} e'_P \\ e'_P G^M \\ \vdots \\ e'_P G^{(N-1)M} \end{pmatrix}$$

wherein $$e_P' = (0,0, \ldots 0,1) \in B^{1 \times P},$$

and wherein $$Q_P = \begin{pmatrix} e'_P \\ e'_P G^M \\ \vdots \\ e'_P G^{(P-1)M} \end{pmatrix}.$$

15. The bit sequence generator according to claim 9, wherein the processor is further configured to calculate the first sub-rate initial state according to $$y_m(0) = Q_N \cdot x(m)$$

wherein m is an individual number assigned to a respective state machine, wherein the first sub-rate initial state is calculated for, comprising a value equal to or lower than the number of state machines of the plurality of state machines, N is a number of rows of the first sub-rate transition matrix, wherein $$Q_N = \begin{pmatrix} e'_P \\ e'_P G^M \\ \vdots \\ e'_P G^{(N-1)M} \end{pmatrix}$$

wherein $$e_P' = (0,0, \ldots 0,1) \in B^{1 \times P},$$

and wherein P is an order of the generating function and G is a full rate transition matrix, and wherein $$x(0) = x_0 \in B^P$$

$$x(i+1) = G \cdot x(i), i=0,1,2,\ldots,$$

$$s(i) = c' \cdot x(i).$$

16. The bit sequence generator according to claim 1, wherein a second state machine of the plurality of state machines comprises:
   an input for an intermediate rate input signal comprising a first clock rate;
   a deserializer for converting the intermediate rate input signal to a sub rate input signal that has a second clock rate being a fraction of the first clock rate;
   a sub rate finite state machine configured to generate an updated sub rate internal state in dependence on a previous sub-rate internal state and the sub-rate input signal, and to provide a sub-rate output signal in dependence on the previous or updated sub-rate internal state; and
   a serializer configured to serialize the sub rate output signal and generate an intermediate rate output signal having the first clock rate,
   wherein the sub rate finite state machine is configured to update the sub-rate internal state at the second clock rate.

17. The bit sequence generator according to claim 1, wherein a second state machine of the plurality of state machines is operable to, during a time step, generate a second interleaved bit sequence by generating a word stream, each word of the word-stream comprising a plurality of subsequence bits of the second time-interleaved bit sequence, the second state machine comprising:
   a plurality of clock registers, the registers comprising corresponding inputs and corresponding outputs; and a feedback circuit coupled to the corresponding inputs and to the corresponding outputs of the registers and adapted to provide a plurality of feedback signals to the corresponding inputs based on the generating function and a plurality of register output signals generated by the registers, the plurality register output signals being indicative of states of the registers, wherein the second state machine is configured such that a first word defined by the plurality of register output signals comprises a first set of subsequent bits of the second time-interleaved bit sequence and such that a subsequent second word defined by the plurality of register output signals comprise a second set of subsequent bits of the second time-interleaved bit sequence.

18. A system for performing automated test, the system comprising a bit sequence generator that comprises:

a multiplexer configured to output an output bit sequence by successively selecting a respective bit of the output bit sequence from a plurality of time-interleaved bit sequences, wherein the output bit sequence is defined by a generating function and an initial state of the generating function; and a plurality of state machines coupled with the multiplexer and configured to generate the plurality of time-interleaved bit sequences, wherein each of the plurality of state machines is configured to generate a respective time-interleaved bit sequence of the plurality of time-interleaved bit sequence during a time step, wherein a first state machine of the plurality of state machines is configured to generate a first time-interleaved bit sequence of the plurality of time-interleaved bit sequences by generating a respective bit of the first time-interleaved bit sequence during a corresponding time step based on a) at least one preceding bit generated by the first state machine during a preceding time step, b) the generating function, and c) the initial state of the generating function, and independent from another time-interleaved bit sequence generated by another state machine of the plurality of state machines, wherein first time-interleaved bit sequence is generated in a first sub bit rate, wherein further the first state machine comprises a serializer that is configured to: serialize a state sequence of the first respective state machine; select a respective bit of the first time-interleaved bit sequence from the state sequence; and provide the first time-interleaved bit sequence in a serial manner with an intermediate bit rate, wherein the intermediate bit rate is equal to the first sub bit rate multiplied with a first predefined number of bits of the first time-interleaved bit sequence.

19. A method of generating an output bit sequence defined by a generating function and an initial state of the generating function, the method comprising:

generating a plurality of time-interleaved bit sequences through a plurality state machines, wherein a respective time-interleaved bit sequence of the plurality of time-interleaved bit is generated by a respective state machine of the plurality state machines in an sub bit rate, wherein generating the respective time-interleaved bit sequence comprises: during a time step,
  (a) receiving, in an intermediate bit rate, a state sequence of the respective state machine that comprises a plurality of state bits in a serial manner; and
  (b) selecting a respective bit of the respective time-interleaved bit sequence from the state sequence,
wherein the generating the respective time-interleaved bit sequence is based on at least one bit generated during a preceding time step,
the generating function,
the initial state of the generating function, and
is independent from another generated time-interleaved bit sequence of the plurality of time-interleaved bit sequences; and wherein the intermediate bit rate is equal to the sub bit rate multiplied with a predefined number of bits of the respective time-interleaved bit sequence; and successively selecting one bit from the plurality of time-interleaved bit sequences to generate the output bit sequence.

20. The method according to claim 19 further comprising calculating a respective sub-rate transition matrix and a respective sub-rate initial state for a respective state machine of the plurality of state machines by performing:

calculating the respective sub-rate initial state based on the generating function, the initial state of the generating function and a number of state machines of the plurality of state machines, wherein the output bit sequence is a full rate bit sequence; and calculating the respective sub-rate transition matrix for the respective state machine based on the generating function and the number of state machines.

* * * * *